(12) United States Patent
Yang

(10) Patent No.: US 11,855,599 B2
(45) Date of Patent: *Dec. 26, 2023

(54) CIRCUITS, EQUALIZERS AND RELATED METHODS

(71) Applicant: TAIWAN SEMICONDUCTOR MANUFACTURING COMPANY LTD., Hsinchu (TW)

(72) Inventor: Shu-Chun Yang, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/060,970

(22) Filed: Dec. 2, 2022

(65) Prior Publication Data

US 2023/0120991 A1 Apr. 20, 2023

Related U.S. Application Data

(63) Continuation of application No. 16/886,653, filed on May 28, 2020, now Pat. No. 11,528,003.

(51) Int. Cl.
   *H03F 3/45* (2006.01)
   *H03G 5/16* (2006.01)
   *H03F 1/56* (2006.01)

(52) U.S. Cl.
   CPC ......... *H03G 5/165* (2013.01); *H03F 3/45179* (2013.01); *H03F 1/56* (2013.01)

(58) Field of Classification Search
   CPC ........ H03G 5/165; H03G 1/0029; H03G 5/28; H03F 3/45179; H03F 1/56; H03F 2203/45488; H03F 3/45197
   USPC .................................................. 330/253, 254
   See application file for complete search history.

(56) References Cited

U.S. PATENT DOCUMENTS 6,870,404 B1 * 3/2005 Maangat ........... H04L 25/03878
                                                                327/111

* cited by examiner

*Primary Examiner* — Andrea Lindgren Baltzell
*Assistant Examiner* — Khiem D Nguyen
(74) *Attorney, Agent, or Firm* — WPAT LAW; Anthony King

(57) ABSTRACT

A circuit is disclosed, in accordance with some embodiments. The circuit includes a transistor stage, a resistive element, a first tunable capacitive element and a second tunable capacitive element. The transistor stage includes a first input/output terminal and a second input/output terminal. The resistive element is connected to the transistor stage. The first tunable capacitive element is connected in parallel with the resistive element. The second tunable capacitive element is connected to the second input/output terminal of the transistor stage. The first tunable capacitive element and the second tunable capacitive element are configured to be selectively turned on and off to provide different frequency responses.

20 Claims, 13 Drawing Sheets

CIRCUITS, EQUALIZERS AND RELATED METHODS

PRIORITY CLAIM AND CROSS-REFERENCE

This application is a continuation application of U.S. patent application Ser. No. 16/886,653, filed on 28 May 2020, which application is hereby incorporated herein by reference.

BACKGROUND

Amplifiers and equalizers are commonly used in high-speed circuits, such as high-speed receivers. For short-channel applications, simple amplification may suffice. For long-channel application, equalizers may be used to boost certain spectral portions of the signal relative to the other portions.

Voltage gain amplifiers (VGAs) and continuous-time linear equalizers (CTLEs) can be used to compensate signal losses. To minimize distortion, a configuration of a CTLE following a VGA can be used. In such a configuration, a wide overall bandwidth is desirable. Also, a more precise control of the frequency response of such a configuration, such as which spectral portion is amplified and by how much, is also desirable.

Efforts in designing related amplifiers, equalizers and systems with improved characteristics are therefore ongoing.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
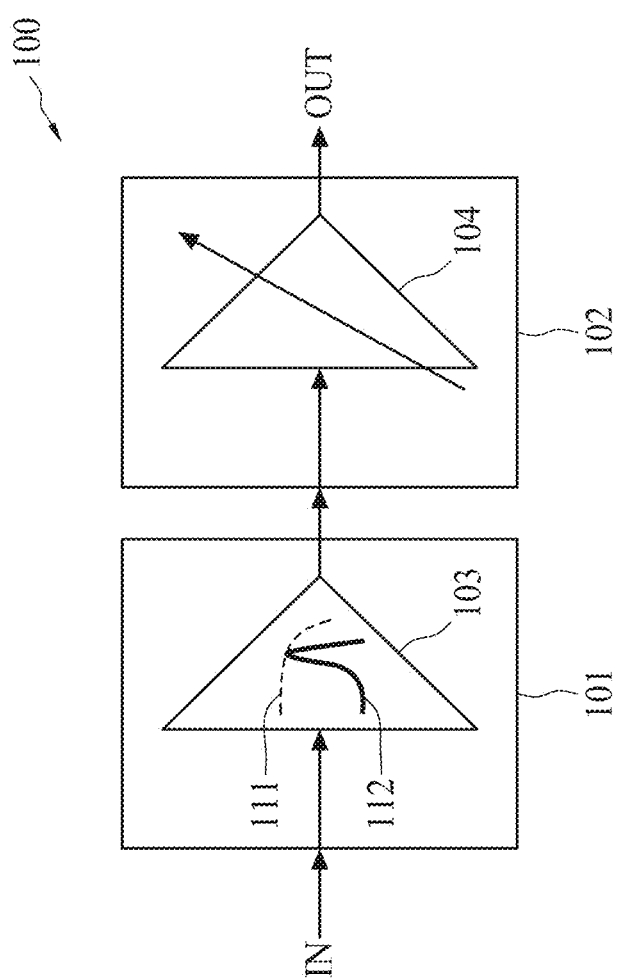
FIG. 1 is a schematic illustration of a receiver in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Amplifiers and equalizers are commonly used in high-speed circuits, such as those that serve communication functions. In a communication system, a signal can be transmitted by a transmitter, pass a channel that affects the signal, and be received a receiver. The channel effects on the signal may be spectral. That is, the channel may be viewed as having a frequency response that shapes the signal spectrum. The shaping could distort the signal.

A channel may be classified by its effects on the signals passing the channel. A channel may be called "short" if the spectral distortion of the signal is within design tolerance. For example, a channel with a substantially flat frequency response in a frequency region of interest (or a "band" of interest) may be called a short channel. A channel with a higher roll-off frequency (sometimes referred to as a "wider" channel) may be called a short channel. The processing of signals having passed a short channel may be simple, such as simple amplification without spectral shaping.

A channel may be called "long" if the channel distorts the signal spectrum sufficiently to require more complicated signal processing techniques in the receiver that receivers the signal. For example, the receiver may include a (circuit) block that spectrally shapes the received signal to compensate for the channel distortion. An equalizer is an example for such a block and may have a non-flat frequency response in at least one frequency region of interest. The term "non-flat frequency response" is used in accordance with its meaning generally understood by persons having ordinary skill in the art as a frequency response with a gain that does not vary substantially over one or more frequency regions. In other words, an equalizer may be employed to boost certain spectral portions of the signal relative to the other portions.

A continuous time linear equalizer (CTLE) is a type of equalizer. A CTLE may be implemented as a circuit, such as a circuit including semiconductor devices. A CTLE may be used in a communication system that employs pulse-amplitude modulation (PAM), such as an M-ary PAM. An example is a PAM-4 system, where the information source emits a sequence of symbols from an alphabet that consists of 4 symbols, each symbol capable of representing two bits of information. If the symbol duration is T seconds, than 1/T is referred to as the signaling rate, expressed in symbols per second or bauds.

The channel condition may vary over time. The same receiver may receive signals that have been subject to both short and long channel conditions. That is, the same equalizer circuit may have to adapt its frequency response in response to different channel conditions. In other words, an equalizer may be said to operate in different modes under different channel conditions.

When the channel is long, i.e., when there is attenuation in a frequency region of interest, the CTLE may operate in a first mode that may be called an equalizer mode and provides more gain in the frequency of interest. The gain may be higher than unity.

When the channel is short, i.e., when there is less or insignificant attenuation in a frequency region of interest, less gain from the CTLE is needed, in which case the CTLE may be said to operate in a second mode that may be called a buffer mode. In fact, if CTLE provides the same gain for a long-channel condition to a signal coming from a short channel, the gain amount could be too much to preserve linearity of the received signal. The signal distortion from non-linearity (which may be manifested in closed eyes in an eye diagram of the signal) may propagate to the other blocks in the receiver. Hence, when operating in the second mode, the CTLE may provide less gain than when operating in the first mode. The signal gain may be unity, which is the reason why the second mode may be called "buffer" mode. The gain in the second mode, of course, may be higher or lower than unity in the frequencies of interest.

Both the DC gain level and the AC gain level of the CTLE may be controlled. The DC gain level may be controlled in accordance with the requirements arising from a circuit (such as a (variable-gain) amplifier) following the CTLE. The AC gain level may be controlled to reduce or eliminate signal distortion. The control of the gain levels may contribute to less signal distortion (such as spectral distortion and non-linearity) and a better quality in the eye diagrams.

Conventional CTLEs, however, may provide too large a DC gain, which damages signal linearity. Conventional CTLEs may also fail to provide sufficient amount of AC gain in the frequencies of interest, by providing too little gain or providing gain in frequencies deviated from those of interest or both.

In the present disclosure, an improved circuit is disclosed. The circuit can adapt its frequency responses by operating in different modes. The operating mode may be controlled by switching, or by turning on and off different circuit elements. At least some of such circuit elements may be tunable or programmable, where the electrical characteristics (such as reactance or capacitance value) can be tuned or programmed to different values. In each mode, the gain, the pole/zero locations and/or the shape of the frequency response may be controlled and tuned with finer details and precision. In some embodiments, a pole whose location is determined at least in part by to the mode of the circuit may be selectively introduced. In some embodiments, a dominant pole may be selectively introduced depending on channel conditions.

Further, it will be understood that when an element is referred to as being "connected to" or "coupled to" another element, it may be directly connected to or coupled to the other element, or intervening elements may be present.

In the following description, a signal is asserted with a logical high value to activate a corresponding device when the device is active high. In contrast, the signal is de-asserted with a low logical value to deactivate the corresponding device. When the device is active low, however, the signal is asserted with a low logical value to activate the device, and is de-asserted with a high logical value to deactivate the device. Examples of active-high devices include the N-type metal-oxide metal-oxide-semiconductor field-effect transistor (MOSFET, also known as metal-oxide-silicon transistor or MOS transistor) or simply referred to as an NMOS, and the NPN-type bipolar junction transistor (bipolar transistor or BJT). Examples of active-low devices include the PMOS and the PNP-type BJT.

FIG. 1 is a schematic illustration of a receiver 100, in accordance with some embodiments of the present disclosure.

The receiver 100 receives a signal at an input IN and outputs a signal at an output OUT. The receiver 100 includes an equalizer 101 and an amplifier 102. The equalizer 101 may precede the amplifier 102, although the order may switch.

The receiver 100 may be used in a communication system. The communication system may be a wired communication system and may be a high-speed communication system. For example, the communication system may operate at a data rate of 112 Gbps, which translates into 56 GBaud under a PAM-4 modulation scheme. A Nyquist frequency in this case is 28 GHz. A communication system may be found in a high-speed serializer/deserializer (SerDes) application.

The equalizer 101 may be a CTLE. The equalizer 101 may include a gain stage 103. The gain stage 103 may be a transistor stage including transistors. The gain stage 103 has a frequency response, which may be controllable and variable. In some embodiments, the gain stage 103 may have a first frequency response 111 (in dashed line) and a second frequency response 112 (in solid line), depending on circumstances (such as channel conditions), user needs and/or the operating mode of the equalizer 101.

The first frequency response 111 may have a low-pass nature and may be suitable under short channel condition. In some embodiments, the first frequency response 111 may provide a substantially flat gain in a frequency region of interest or up to a certain cut-off (roll-off) frequency.

The second frequency response 112 may provide more gain in certain frequencies of interest than the other frequencies. This gain/amplification may be called "boost"; thus, the amount of such gain may sometimes be referred to as "boost amount" and the frequency or frequencies at which the gain is provided may sometimes be referred to as "boost frequency/frequencies". Although the peak gain of the second frequency response 112 illustrated in FIG. 1 is lower than the envelope of the first frequency response 111, this is not a limitation to the present disclosure. The gain of the second frequency response 112 may be higher than the first frequency response 111 at some frequencies.

The amplifier 102 may be a voltage-gain amplifier (VGA) and include a gain stage 104. The amplifier 102 may be a variable-gain amplifier. The gain stage 104 may provide signal gain substantially identical across different frequencies.

To compensate for channel losses and/or minimize signal distortion, a CTLE may be combined with a VGA. However, such a configuration diminishes the overall bandwidth. For example, the overall bandwidth for a three-band configuration is about 0.35*(bandwidth of a single band). Moreover, if the gain of the CTLE and the VGA is not carefully selected, degraded signal linearity may appear and propagate to the next stages in the receiver.

Figure 2:
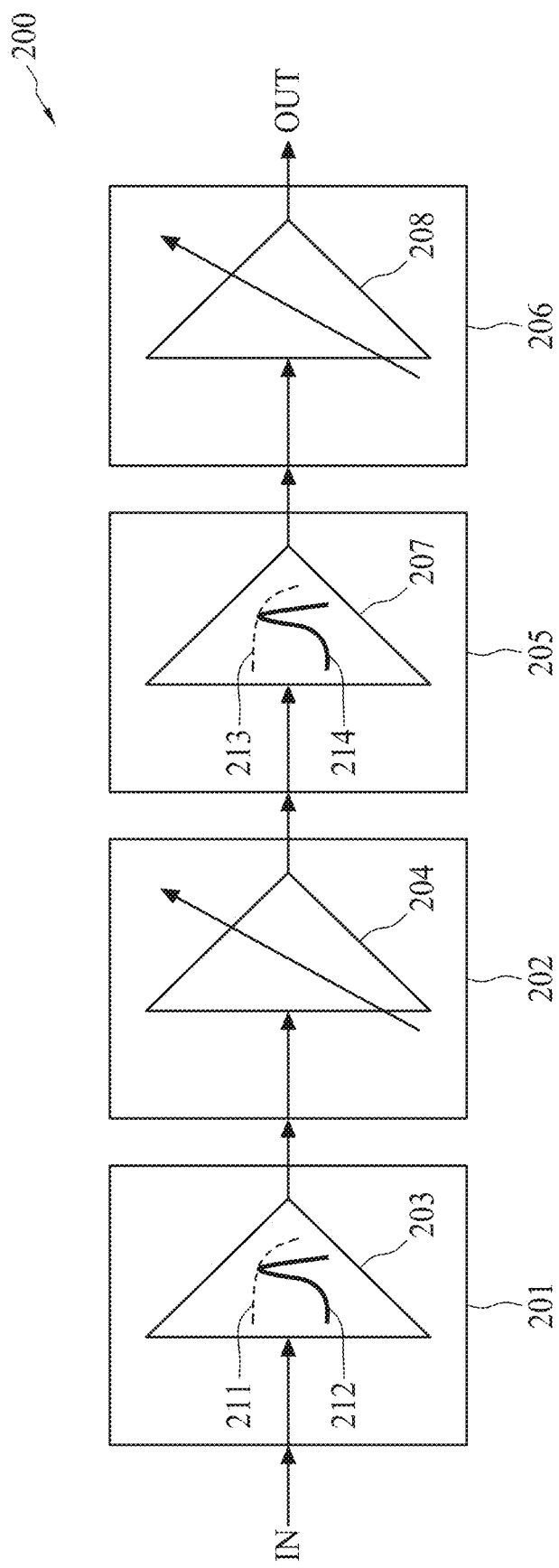
FIG. 2 is a schematic illustration of a receiver in accordance with some embodiments of the present disclosure.

FIG. 2 is a schematic illustration of a receiver 200 in accordance with some embodiments of the present disclosure.

The receiver 200 receives a signal at an input IN and outputs a signal at an output OUT. The receiver 200 includes an equalizer 201, an amplifier 202, an equalizer 205 and an amplifier 206.

Similar to the equalizer 101, the equalizer 201 may be a CTLE and may include a gain stage 203 having a first frequency response 211 and a second frequency response 212. Similarly, the equalizer 205 may be a CTLE and may include a gain stage 207 having a third frequency response 213 and a fourth frequency response 214. Similar to the amplifier 102, the amplifier 202 and the amplifier 206 may respectively include a gain stage 204 and a gain stage 208.

As there are more blocks in the receiver 200 than in the receiver 100, signal non-idealities such as non-linearity arising in one block may propagate to the remaining blocks, which is not desirable.

Figure 3:
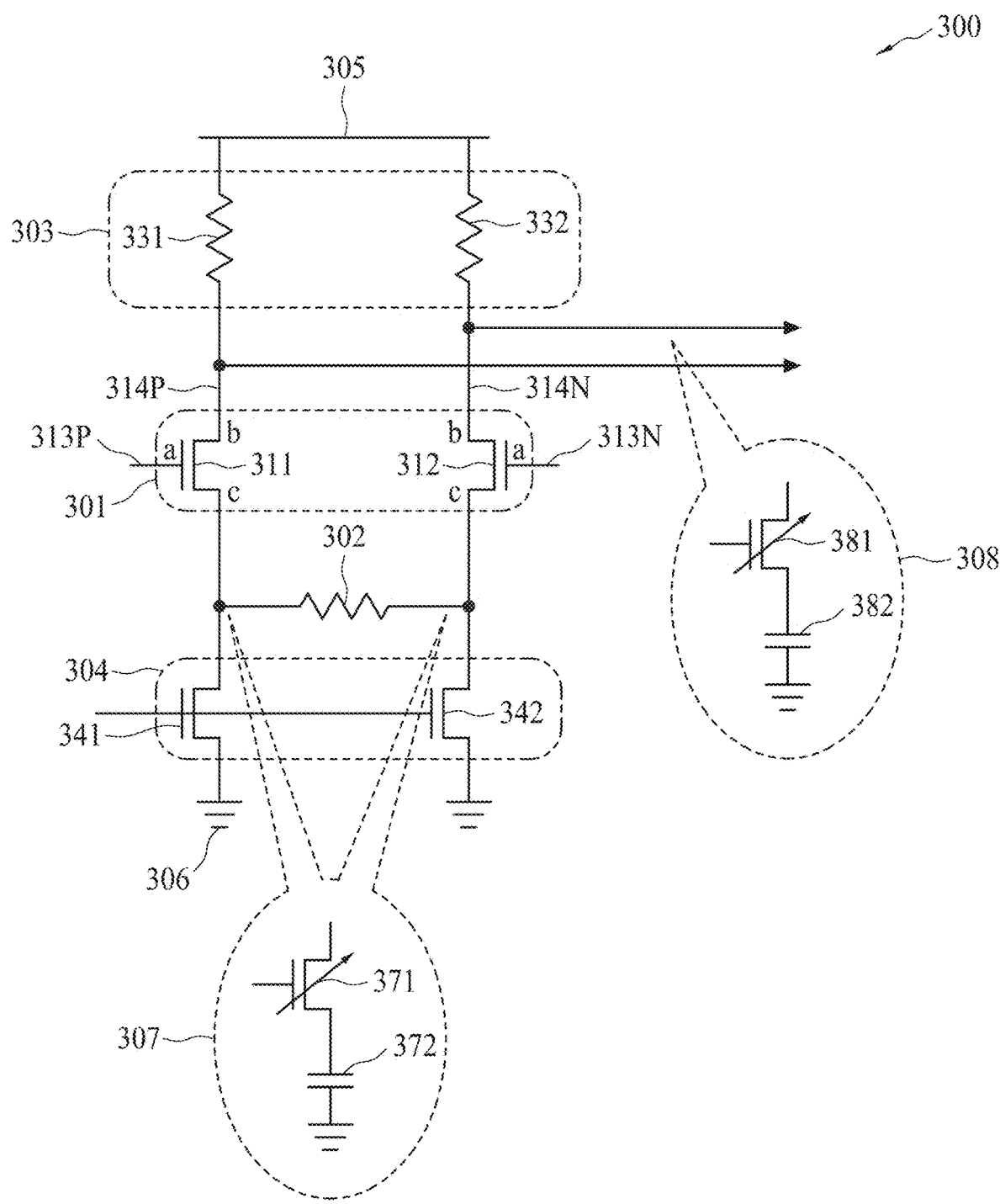
FIG. 3 is a schematic illustration of an equalizer in accordance with some embodiments of the present disclosure.

FIG. 3 is a schematic illustration of a circuit 300, in accordance with some embodiments of the present disclosure.

The circuit 300 may be an equalizer, such as a CTLE. As illustrated in FIG. 3, the circuit 300 includes a transistor stage 301, a resistive element 302, a load stage 303, a bias stage 304, a capacitive element 307 and a capacitive element 308. The circuit 300 may be connected to a power supply 305 and a power supply 306. In some embodiments, the power supply 305 may be a first power supply, such as VDD or analog (AVDD). In some embodiments, the power supply 306 may be a second power supply, such as ground, VSS or analog (AVSS). The circuit 300 may include an input and an output (not shown in the figure).

Although the circuit 300 is illustrated in FIG. 3 as in a differential-pair configuration, this is not a limitation to the present disclosure. The skilled person understands that a half-circuit configuration is also within the scope of the present disclosure.

The transistor stage 301 includes at least one transistor. The transistor stage 301 may include a transistor 311 and a transistor 312. In some embodiments, the transistor stage 301 may be a transistor pair or a differential transistor pair. In some embodiments, the transistors 311, 312 may form a differential transistor pair. In some embodiments, the transistors 311, 312 may be viewed as effective input transistors because the transistors 311, 312 can be viewed as an input of the circuit 300.

The transistor 311 includes a control terminal 311a, a first main terminal 311b and a second main terminal 311c. For example, the transistor 311 may be an NMOS having a gate as the control terminal 311a, a drain as the first main terminal 311b and a source as the second main terminal 311c. Similarly, the transistor 312 includes a control terminal 312a, a first main terminal 312b and a second main terminal 312c. For example, the transistor 312 may an NMOS having a gate at terminal a, a drain at terminal b and a source at terminal c.

The transistor stage 301 may include more than one input/output terminal. In some embodiments, the transistor stage 301 includes an input terminal 313P and an input terminal 313N, and an output terminal 314P and an output terminal 314N. In the example illustrated in FIG. 3, the control terminals 311a, 312a of the transistors 311, 312 respectively serve as the input terminal 313P and the input terminal 313N of the transistor stage 301. In the example illustrated in FIG. 3, the first main terminals 311b, 312b of the transistors 311, 312 respectively serve as the output terminal 314P and the output terminal 314N of the transistor stage 301.

In some embodiments, the transistor stage 301 may include a differential input and a differential output. In the example illustrated in FIG. 3, the control terminals 311a, 312a of the transistors 311, 312 form a differential input of the transistor stage 301, and the first main terminals 311b, 312b of the transistors 311, 312 form a differential output of the transistor stage 301.

The resistive element 302 may be connected to the transistor stage 301. In some embodiments, the resistive element 302 is directly connected to the transistor stage 301 without any intervening circuit elements. In some embodiments, the resistive element 302 is connected in parallel to the transistor stage 301. In some embodiments, the resistive element 302 may be a resistor. In the example illustrated in FIG. 3, the two terminals of the resistive element 302 are respectively connected to the second main terminals 311c, 312c of the transistors 311, 312. In some embodiments, the resistive element 302 has a substantially constant resistance value. In some embodiments, the resistive element 302 is a variable resistor.

Since the resistive element 302 may be connected to the source of the transistors 311, 312, it may sometimes be referred to as a source-degeneration resistance.

The load stage 303 is connected to the transistor stage 301. In some embodiments, the load stage 303 is connected in series to the transistor stage 301, and may additionally be connected to the power supply 305. In some embodiments, the load stage 303 may be connected to the output terminals 314P, 314N.

The load stage 303 may include a resistive element, such as a resistor 331 and/or a resistor 332. The resistance value of the resistors 331, 332 may be substantially fixed. The resistors 331, 332 may form in a pair that matches the transistor stage 301 implemented as a differential pair.

The bias stage 304 is connected to the transistor stage 301 and the resistive element 302. The bias stage 304 may be connected in series to the transistor stage 301 and in parallel to the resistive element 302. The bias stage 304 illustrated in the example of FIG. 3 includes a transistor 341 and a transistor 342, but other configurations are also possible. In some embodiments, the bias stage 304 may comprise a current source. The bias stage 304 may be connected between the transistor stage 301 and the power supply 306.

Note that as the skilled person will understand, each of the circuit nodes in the example illustrated in FIG. 3 may exhibit parasitic capacitive effect and thus a parasitic capacitor may be considered as being connected to the circuit node, even though a capacitor is not explicitly drawn. Note also that a symbol of a capacitive element, if explicitly drawn, usually indicates a deliberately designed capacitive element (such as a capacitor) and not a parasitic capacitor, unless explicitly stated or otherwise indicated.

The capacitive element 307 is connected to the resistive element 302. In some embodiments, the capacitive element 307 is connected in parallel to the resistive element 302. The capacitive element 307 may also be connected to the transistor stage 301 and the bias stage 304. The transistor stage 301 may be viewed as being connected in parallel to a parallel R-C combination. In some embodiments, the capacitive element 307 may comprise a first tunable, switchable, programmable capacitor connected between a first terminal of the resistive element 302 and a second tunable, switchable, programmable capacitor between a second terminal of the resistive element 302 with characteristics substantially mirroring the first one; in such a case, the circuit 300 may still operate as a differential pair and be analyzed in the equivalent half-circuit configuration.

The capacitive element 307 may be a tunable, switchable or programmable capacitive element (capacitor). The capacitive element 307 may be tunable, switchable and programmable. The capacitive element 307 may comprise at least one switch 371 and at least one capacitor 372. The capacitor 372 may have a variable capacitance value.

The capacitive element 308 is connected to the output terminal of the circuit 300. In some embodiments, the capacitive element 308 is connected to both the output terminals 314P, 314N; this configuration is certainly within the scope of the present disclosure because, as the skilled person will understand, circuit elements in a differential pair may include two mirroring elements/branches.

The capacitive element 308, similar to the capacitive element 307, may be tunable, switchable and/or programmable, and may include at least one switch 381 and at least one capacitor 382 with a possibly variable capacitance value.

The transistors 311, 312, 341, 342 may be NMOS, PMOS, other suitable types of field-effect-transistors, NPN BJT, PNP BJT, other suitable types of BJT, and other suitable types of transistors or circuit elements. The switches 371, 381 may be implemented with any suitable type of switches.

Figure 4:
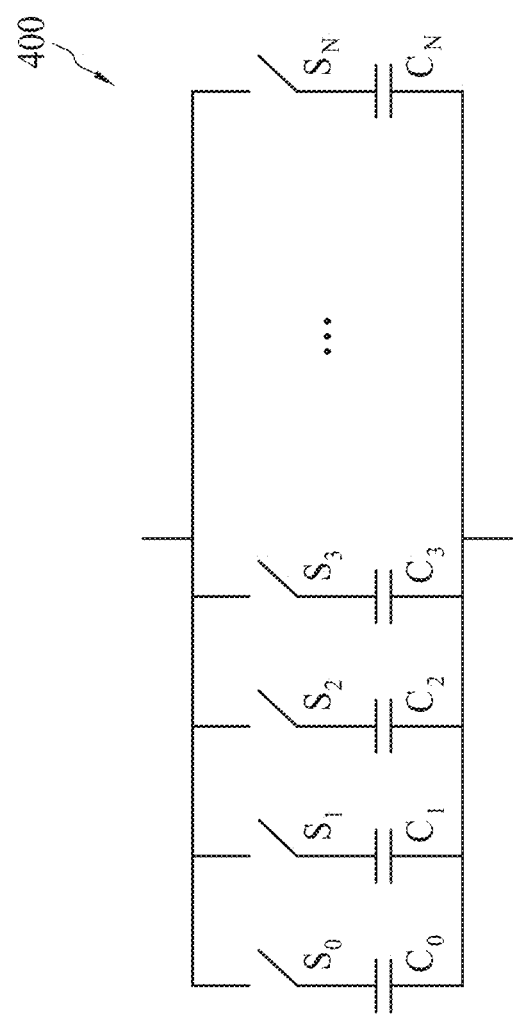
FIG. 4 is a schematic illustration of a capacitive element that can be used in an equalizer in accordance with some embodiments of the present disclosure.

FIG. 4 is a schematic illustration of a programmable capacitor bank 400 that can be used in an equalizer in accordance with some embodiments of the present disclosure.

The programmable capacitor bank 400 may be used as the capacitive element 307 and/or the capacitive element 308 illustrated in FIG. 3.

The programmable capacitor bank 400 includes a plurality of switches $S_0$, $S_1$, $S_2$ . . . $S_N$, and capacitors $C_0$, $C_1$, $C_2$ . . . $C_N$ respectively connected to the switches $S_1$, $S_2$ . . . $S_N$. The capacitors $C_0$, $C_1$, $C_2$ . . . $C_N$ may each have a capacitance value of an integer power of two. By turning on and off the switches $S_0$, $S_1$, $S_2$ . . . $S_N$, the programmable capacitor bank 400 may provide a wide range of different capacitance values.

Figure 5A:
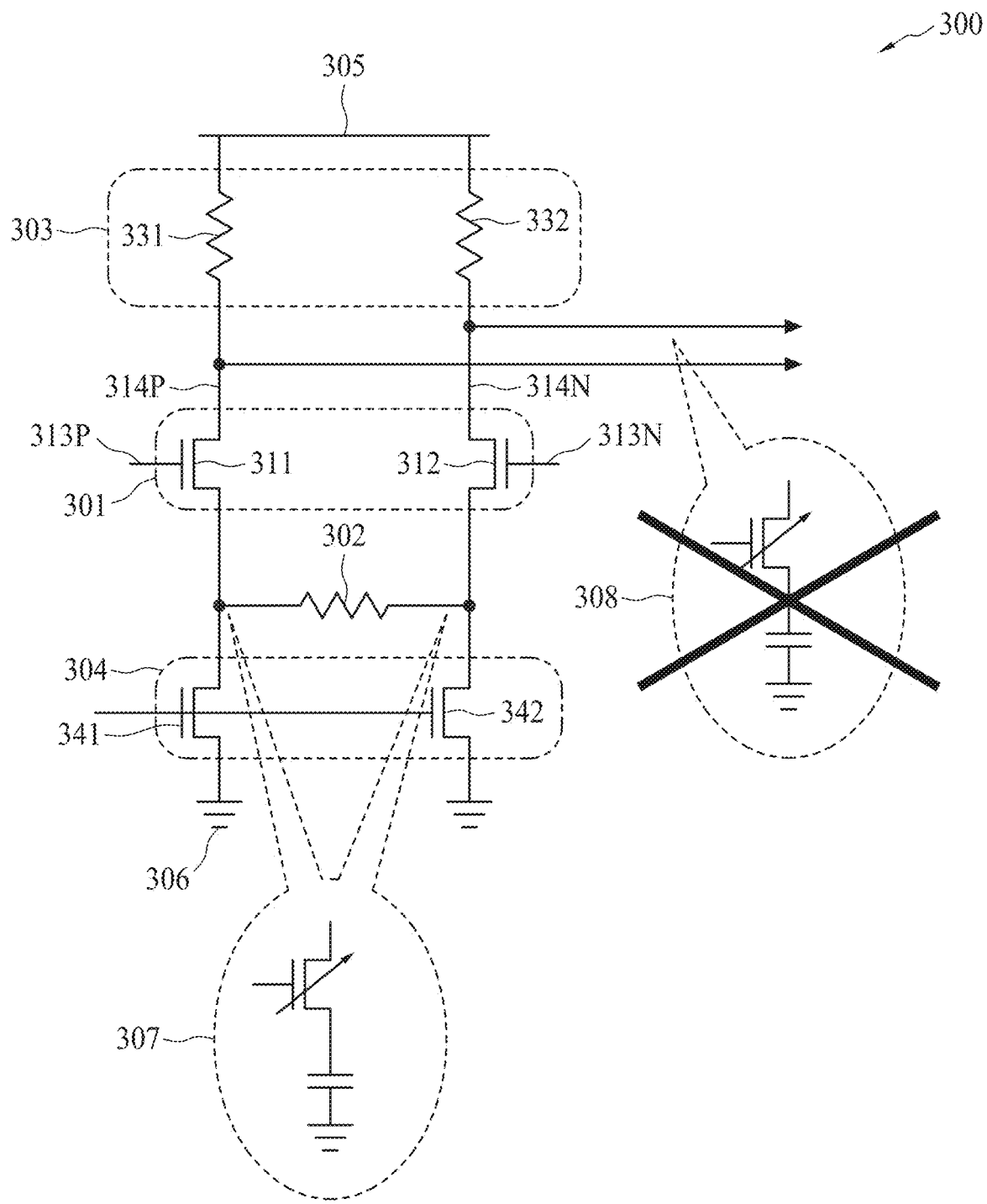
FIG. 5A is a schematic illustration of an operation of an equalizer in accordance with some embodiments of the present disclosure.

FIG. 5A is a schematic illustration of an operation of an equalizer in accordance with some embodiments of the present disclosure.

The circuit 300 may operate in different modes, such as a first mode and a second mode, and may provide different frequency responses in different modes.

FIG. 5A illustrates the operation in a first mode, in which the capacitive element 307 is turned on and the capacitive element 308 is turned off. When turned off, a capacitive element effectively acts as a high impedance connection to the ground; nevertheless, there could still be parasitic capacitance at the output node.

From circuit analysis theory known by the skilled person, the circuit 300 in the first mode has a transfer function with the form of:

$$H(s) = \frac{g_m}{C_p} \frac{s + \frac{1}{R_g C_S}}{\left(s + \frac{1+g_m R_S/2}{R_g C_S}\right)\left(s + \frac{1}{R_D C_p}\right)} \quad (1)$$

$$\omega_s = \frac{1}{R_g C_S}, \omega_{p1} = \frac{1+g_m R_S/2}{R_g C_S}, \omega_{p2} = \frac{1}{R_D C_p} \quad (2)$$

Where: $DC\ \text{gain} = \frac{g_m R_D}{1+g_m R_S/2}$, Ideal peak gain = $g_m R_D$ That is, the R-C combination at the source of the transistors 311, 312 forms a zero and a first pole, and the R-C combination at the output forms a second pole.

In the first mode, the bandwidth is dominated by the pole from the output parasitic capacitance, meaning the second pole is higher than the first pole. Since the parasitic capacitance usually has a low value, the total bandwidth is high.

The first pole is usually higher than the zero by virtue of the gain term (1+$g_m R_s$/2), so the gain curve of the frequency response starts rising around the zero and then starts flattening around the first pole. This typically results in a peaked shape in the middle of the frequency response curve, and thus the increased gain in such frequencies may sometimes be referred to as "boosting" or "boost gain". This gain may be used to compensate for long channel effects, so the first model may be referred to as the equalization mode.

The variable capacitance due to the capacitive element 307 may allow the tuning of the first pole, and therefore the shape of the frequency response curve, and therefore the gain amount in frequencies of interest.

Since the circuit 300 may tune the boost gain in the first mode by the variable source-degeneration capacitance provided by the capacitive element 307, the boost gain tuning (when boost gain is needed) would create little impact to the location of the second pole and, consequently, would not negatively affect the system bandwidth.

Figure 5B:
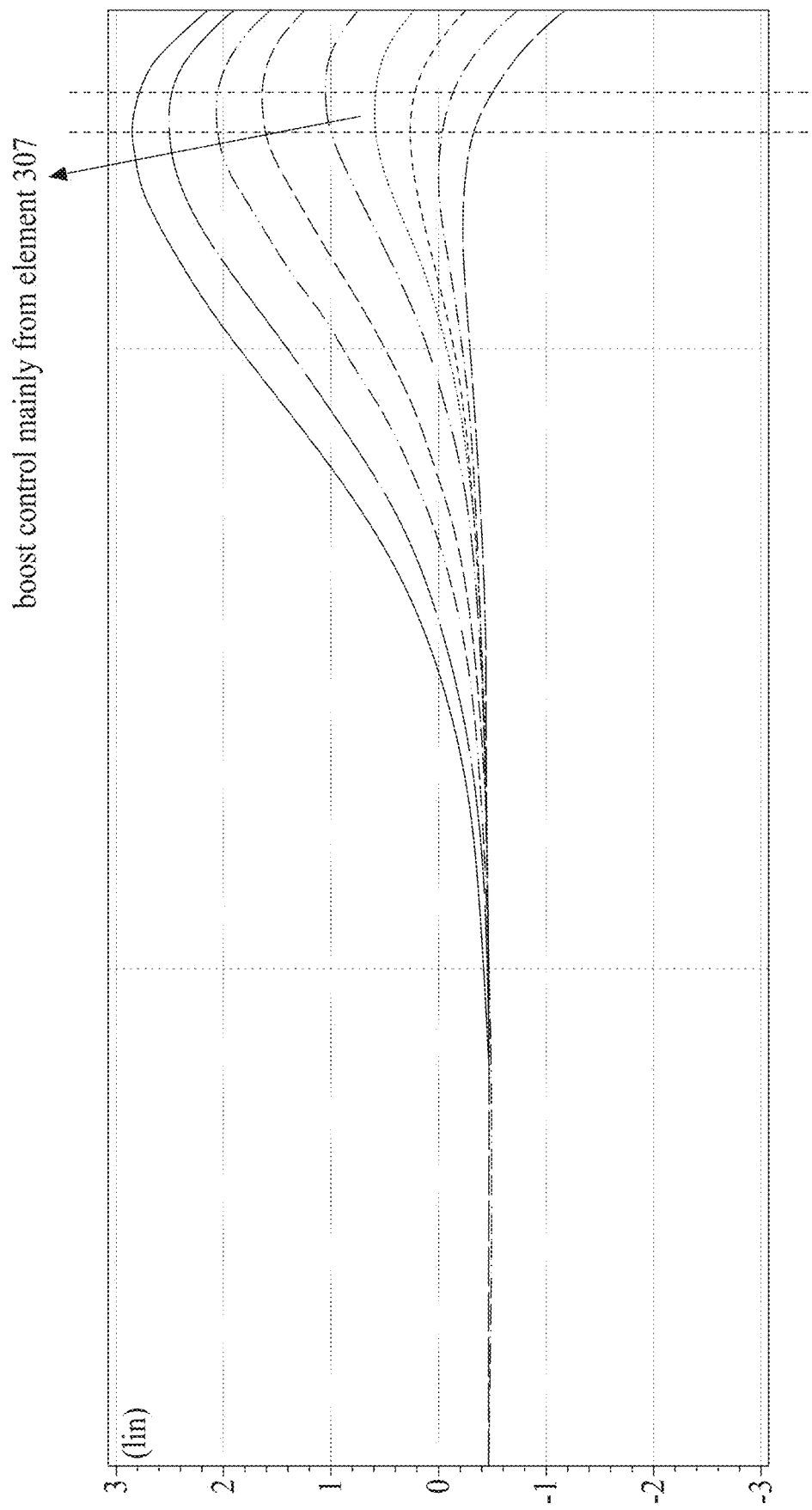
FIG. 5B is an exemplary spectral response of an equalizer in accordance with some embodiments of the present disclosure.

FIG. 5B is an exemplary spectral response sweep of an equalizer in accordance with some embodiments of the present disclosure.

Several frequency response curves are illustrated in FIG. 5B. The top five (with a gain larger than about 1 dB) indicate the frequency response of the circuit 300 in the first mode, and the two dashed lines indicate the frequencies at which the gain is peaked. FIG. 5B demonstrates that there is little deviation of the peak frequencies when the gain is swept in the first mode; that the deviation of the peak frequencies is little can also be seen from the formulas for $\omega_z$ and $\omega_{p1}$ in expression (2) above.

Figure 5C:
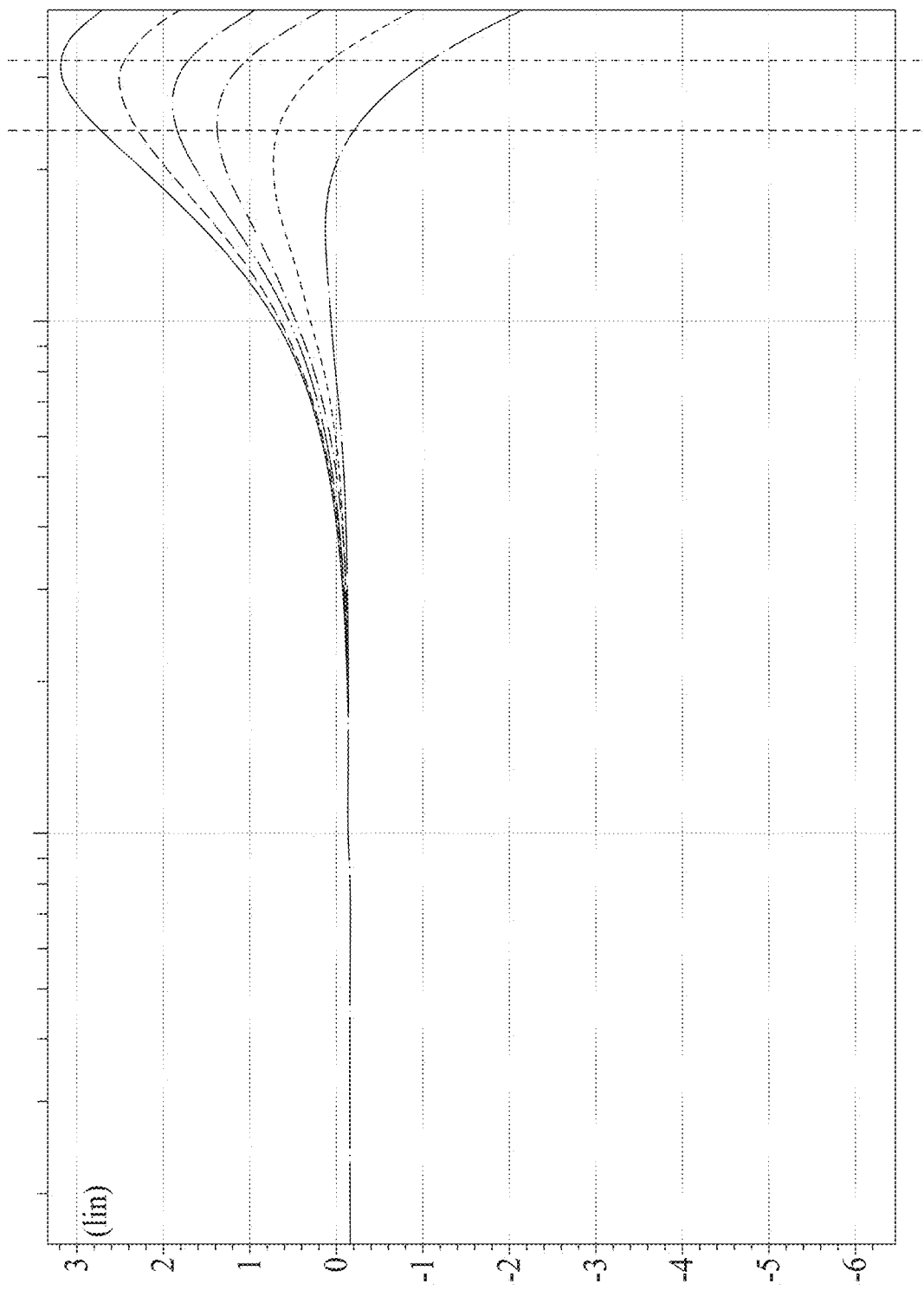
FIG. 5C is an exemplary spectral response sweep of a conventional CTLE.

FIG. 5C is an exemplary spectral response sweep of a conventional CTLE, which illustrates that the frequency deviation that comes with changing the gain from about 3 to about 1 (with the unit being dB, which is 20*log(Gain)) is more than the frequency deviation of the equalizer in accordance with some embodiments of the present disclosure. The difference in the scale of the horizontal axis between FIGS. 5B and 5C demonstrates that the frequency deviation during spectral response sweep is larger in the conventional CTLE.

Figure 6A:
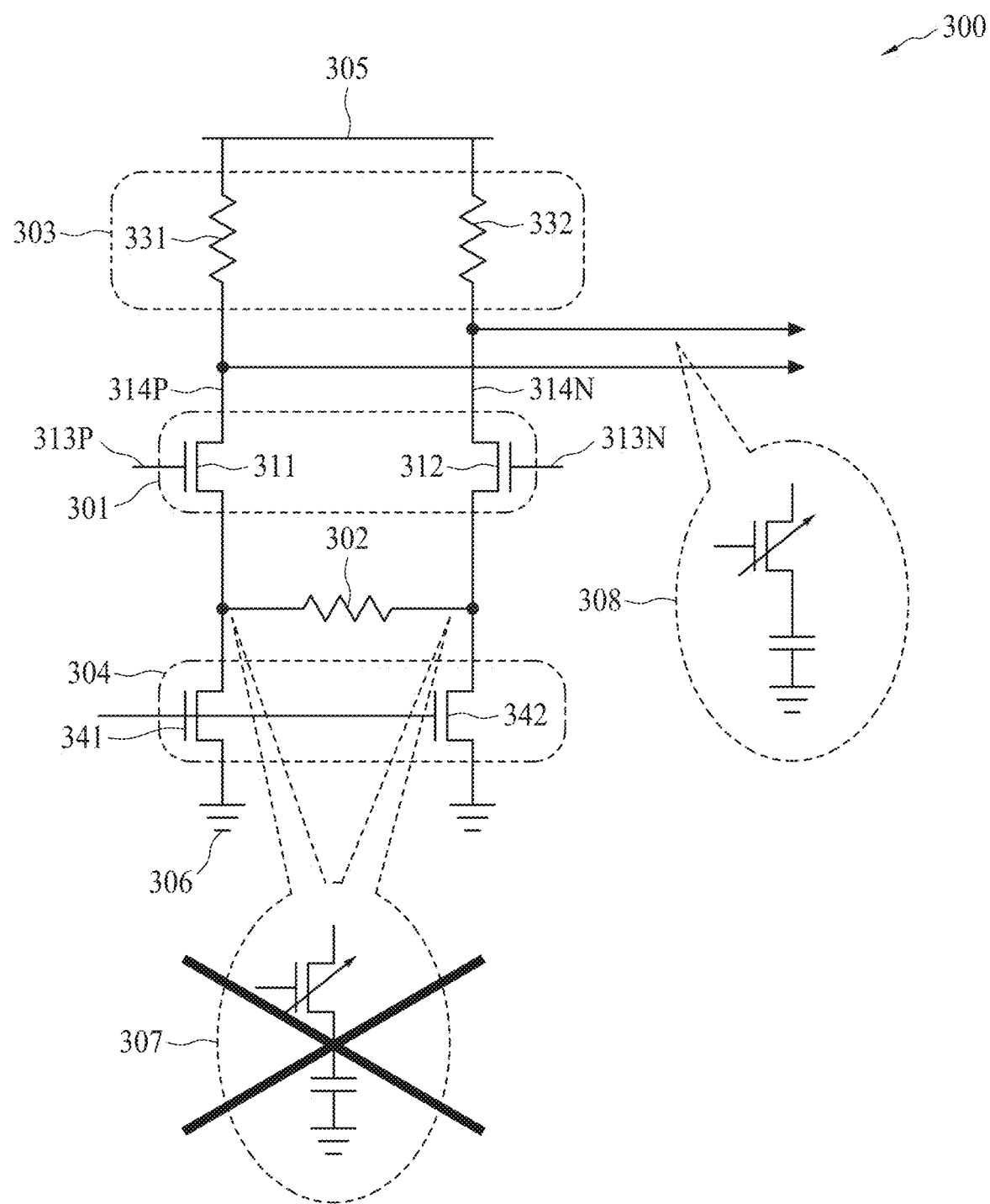
FIG. 6A is a schematic illustration of an operation of an equalizer in accordance with some embodiments of the present disclosure.

FIG. 6A is a schematic illustration of an operation of an equalizer in accordance with some embodiments of the present disclosure.

FIG. 6A illustrates the operation in the second mode, in which the capacitive element 307 is turned off and the capacitive element 308 is turned on.

As shown in expression (2), a $C_S$ term (capacitance seen at the source terminal) exists in the formulas for $\omega_z$ and $\omega_{p1}$. Although the capacitive element 307 is turned off in this mode, some parasitic capacitance (typically lower than the capacitance value of the capacitive element 307 if turned on) may still exist. Hence, $\omega_z$, the zero in the transfer function H(s), would still exist even if the capacitive element 307 is turned off. Because of the zero, some gain is still provided in the frequencies of interest.

A pole may arise from the R-C combination that includes the capacitive element 308 and the resistive elements in the load stage 303. The tunable capacitive element 308 at the output controls the spectral response in the frequencies of interest by tuning the pole arising from this R-C combination. Hence, the capacitive element 308 may contribute to gain control.

The capacitive element 308 may also contribute to the control of the shape of the frequency response curve; e.g., flattening the frequency response curve by pushing the associated pole to a lower frequency. Such flattening may contribute to a decrease in the gain to suit, for example, a channel condition with a lower channel loss. For this reason, the second mode can be referred to as the buffer mode. In some embodiments, the circuit 300 provides less gain in the second mode than in the first mode, at least because of the difference in channel conditions.

In other words, the tunable capacitive element 308 helps push down the gain when the channel condition requires less gain. Moreover, the circuit 300 of the present disclosure retains the ability of gain control in the frequencies of interest because the capacitive element 308 may contribute to the control of the shape of the frequency response curve.

Figure 6B:
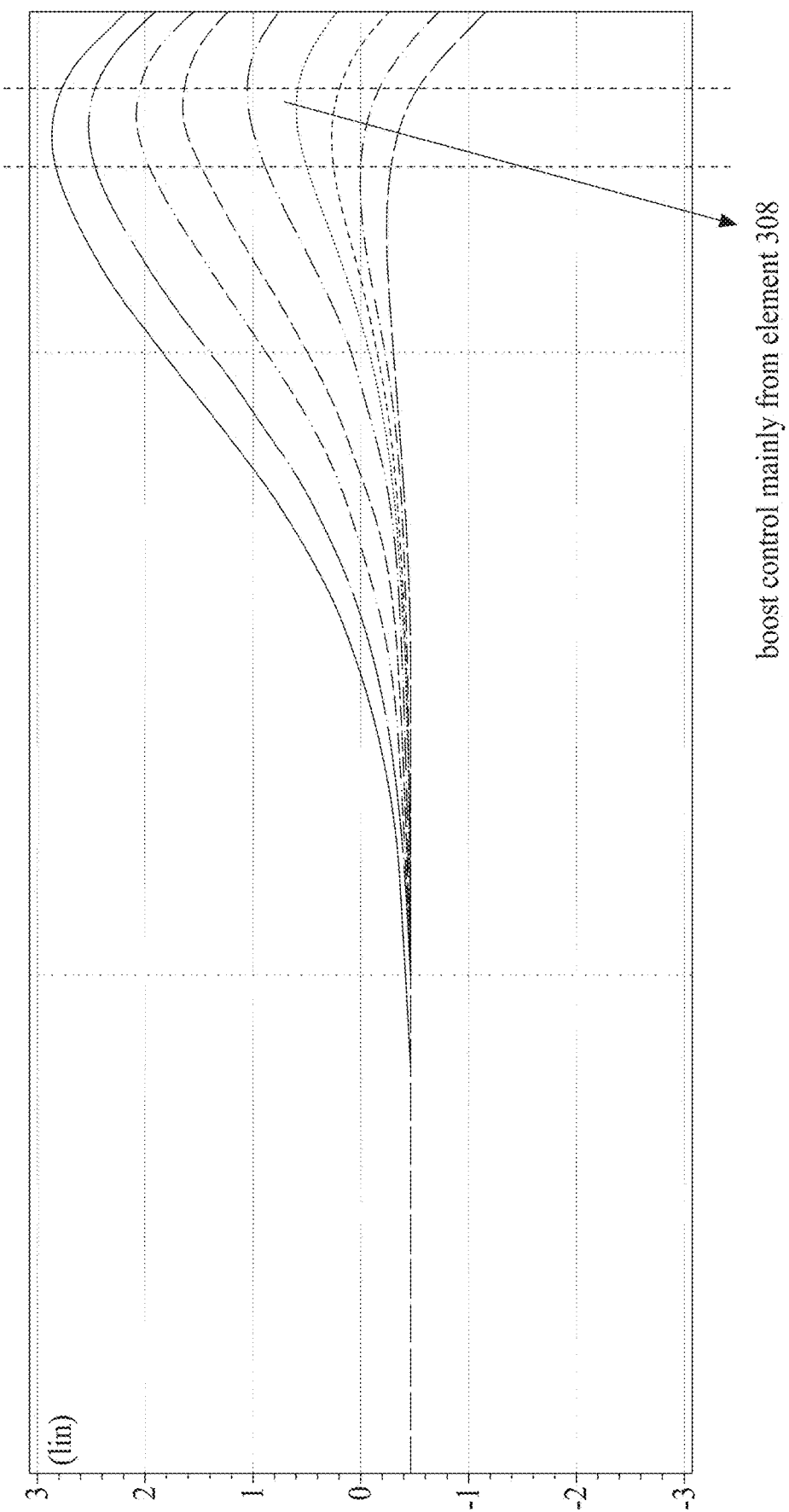
FIG. 6B is an exemplary spectral response of an equalizer in accordance with some embodiments of the present disclosure.

FIG. 6B is an exemplary spectral response of an equalizer in accordance with some embodiments of the present disclosure. In this embodiment, the scale of FIG. 6B is the same as FIG. 5B.

In FIG. 6B, the bottom four (with a gain of less than about 1 dB) indicate the frequency response of the circuit 300 in the second mode, and the two dashed lines indicate the frequencies at which the gain is peaked. FIG. 6B demonstrates that there is little deviation of the peak frequencies when the gain is swept in the second mode; that the deviation of the peak frequencies is little can also be seen from the formulas for $\omega_{p2}$ in expression (2) above.

Figure 7A:
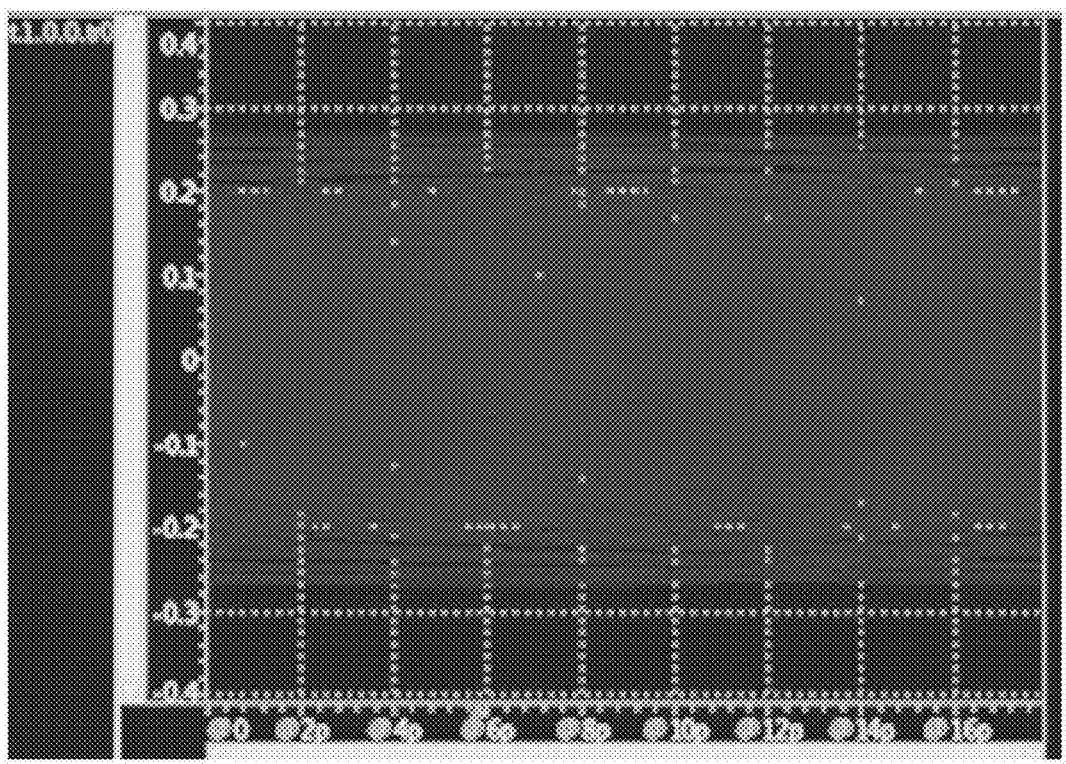
FIG. 7A is a graph illustrating an eye diagram of a signal that has not been equalized.

FIG. 7A is a graph illustrating an eye diagram of a signal that has not been equalized. The eye diagram is taken under the conditions of a data rate of 112 Gbps (56 GBaud with PAM-4) and a channel loss of 15 dB at the Nyquist frequency (28 GHz). Without equalization, the eyes are closed, indicating poor signal quality.

Figure 7B:
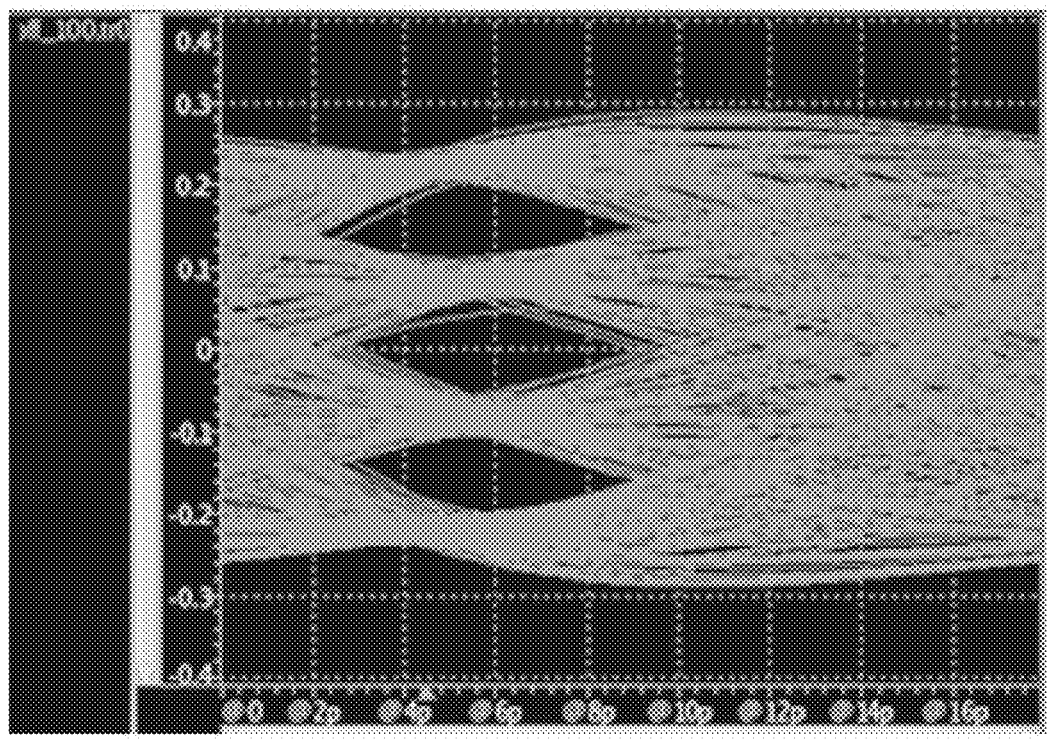
FIG. 7B is a graph illustrating an eye diagram of the signal of FIG. 7A after equalization and in accordance with some embodiments of the present disclosure.

FIG. 7B is a graph illustrating an eye diagram of the signal of FIG. 7A after equalization and in accordance with some embodiments of the present disclosure. With the help from equalization, such as that provided by the (CTLE) circuit 300, the eyes become wider, indicating an improved signal quality.

The circuits according to the present disclosure may provide benefits to the signal quality other than channel loss compensation. As mentioned above, when too much gain is provided when not actually needed, the signal linearity may degrade.

Figure 8A:
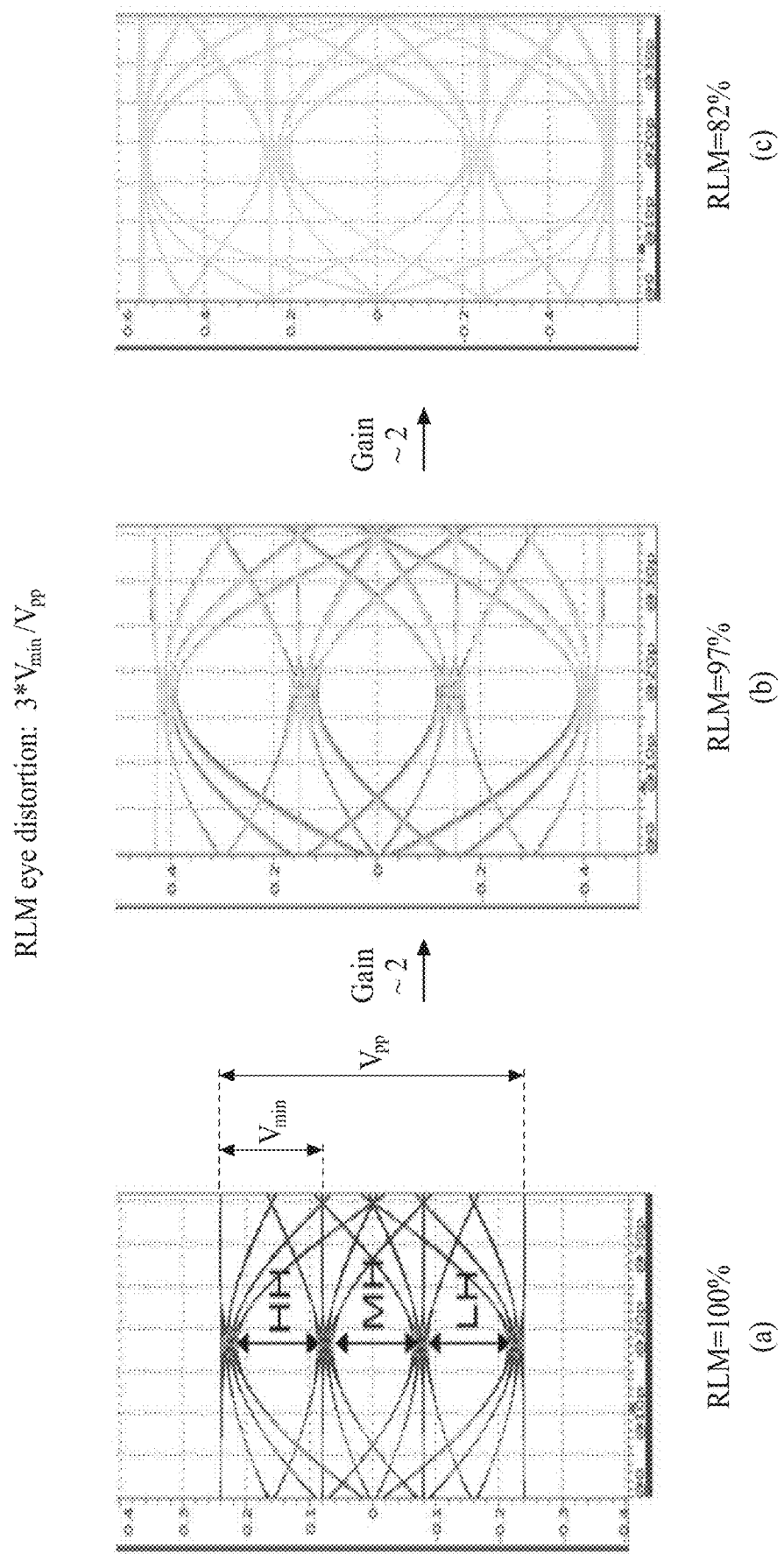
FIG. 8A illustrates an exemplary effect of amplification on signal lineraity as demonstrated by an eye diagram of a signal, in accordance with some embodiment of the present disclosure.

FIG. 8A illustrates an exemplary effect of amplification on signal linearity as demonstrated by an eye diagram of a signal, in accordance with some embodiment of the present disclosure.

Part (a) illustrates the eye diagram of PAM-4 signals with an ideal quality. The eye diagram includes three eyes, the high eye, the middle eye and the low eye.

The signal quality is measured as the ratio of level mismatch (RLM) eye distortion, which is defined as $(3*V_{min}/V_{pp})$, where $V_{min}$ is the height of the highest eye (HH) and $V_{pp}$ is the height of all three eyes combined. A RLM of 100%, as shown in part (a), indicates the ideal signal quality.

Part (b) illustrates the eye diagram of the PAM-4 signals after being subject to a gain amount of 2. The RLM becomes 97% because the linearity degrades slightly.

Part (c) illustrates the eye diagram of the PAM-4 signals after being subject to two stages of a gain amount of 2. The RLM becomes 82% because the linearity degradation from the two stages accumulates.

Figure 8B:
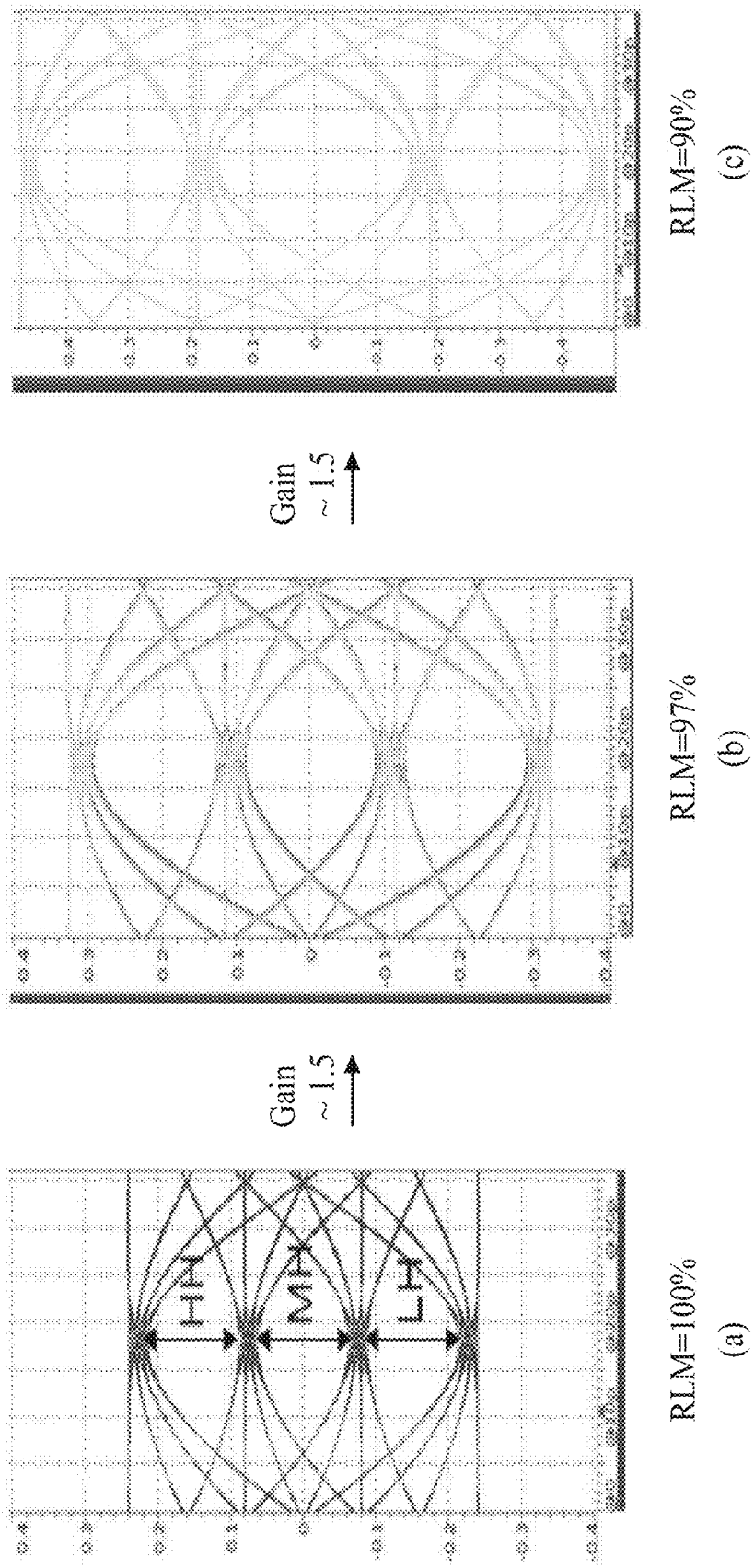
FIG. 8B illustrates an exmplary effect of amplification on signal lineraity as demonstrated by an eye diagram of a signal, in accordance with some embodiment of the present disclosure.

FIG. 8B illustrates an exemplary effect of amplification on signal linearity as demonstrated by an eye diagram of a signal, in accordance with some embodiment of the present disclosure.

Part (a) illustrates the eye diagram of PAM-4 signals with an ideal quality. Part (b) illustrates the eye diagram of the PAM-4 signals after being subject to a gain amount of 1.5. The RLM becomes 97% because the linearity degrades slightly.

Part (c) illustrates the eye diagram of the PAM-4 signals after being subject to two stages of a gain amount of 1.5. The RLM becomes 90%, which is an improvement over the situation in part (c) of FIG. 8A, because the linearity degradation from the two stages accumulates less.

The comparison between FIGS. 8A and 8B demonstrates the benefit of flexible gain tuning to signal linearity.

Figure 9:
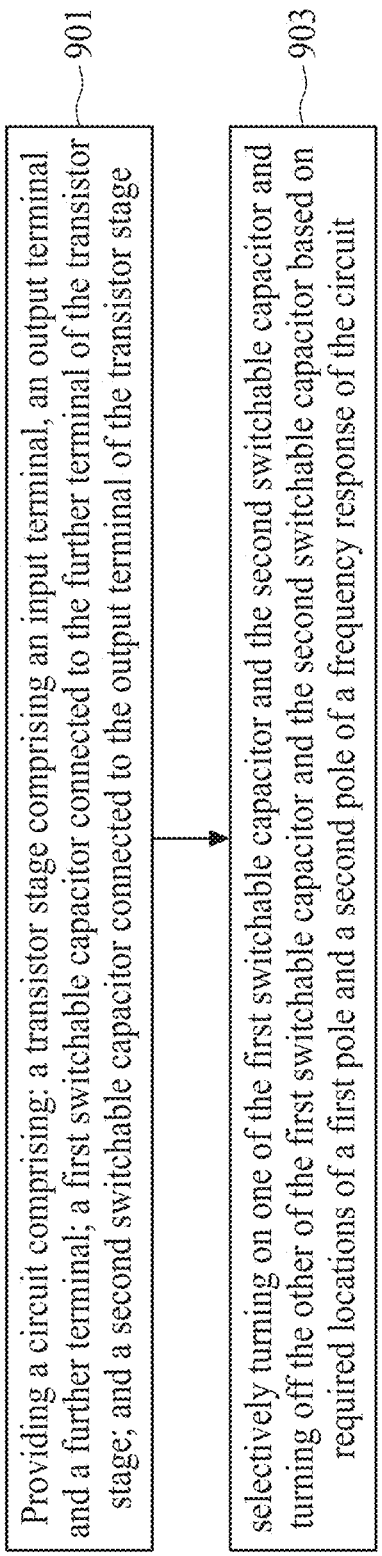
FIG. 9 illustrates an exemplary flow chart for a method in accordance with some embodiments of the present disclosure.

FIG. 9 illustrates an exemplary flow chart for a method in accordance with some embodiments of the present disclosure.

At step 901, a circuit is provided. The circuit may comprise a transistor stage, a first switchable capacitor and a second switchable capacitor. The transistor stage may comprise an input terminal, an output terminal and a further terminal. The first switchable capacitor may be connected to the further terminal of the transistor stage. The second switchable capacitor may be connected to the output terminal of the transistor stage.

At step 903, one of the first switchable capacitor and the second switchable capacitor is selectively turned on, and the other of the first switchable capacitor and the second switchable capacitor is selectively turned on. The selective turning on/off may be based on required locations of a first pole and a second pole of a frequency response of the circuit.

In the present disclosure, a circuit can operate in different modes by selectively turning on or off tunable, variable capacitive elements. Flexibility in providing desired, tunable frequency response results from the provision of more than one such capacitive element.

In some embodiments, a circuit includes a transistor stage, a resistive element, a first tunable capacitive element and a second tunable capacitive element. The transistor stage includes a first input/output terminal and a second input/output terminal. The resistive element is connected to the transistor stage. The first tunable capacitive element is connected in parallel with the resistive element. The second tunable capacitive element is connected to the second input/output terminal of the transistor stage. The first tunable capacitive element and the second tunable capacitive element may be configured to be selectively turned on and off to provide different frequency responses.

In some embodiments, a circuit includes a differential transistor pair, a resistor connected in parallel with the differential transistor pair, a first switchable capacitor and a second switchable capacitor. The differential transistor pair includes a differential input and a differential output. The resistor is connected in parallel with the differential transistor pair. The first switchable capacitor is connected in parallel with the resistor, wherein a first gain of the circuit in a frequency region of interest is determined at least in part by a capacitance value of the first switchable capacitor. The second switchable capacitor is connected to the differential output of the differential transistor pair, wherein a second gain of the circuit in the frequency region of interest is determined at least in part by a capacitance value of the second switchable capacitor. The circuit may be configured such that, in operation, one of the first switchable capacitor and the second switchable capacitor is turned on and the other of the first switchable capacitor and the second switchable capacitor is turned off. The circuit may have the first gain when the first switchable capacitor is turned on and the second gain when the second switchable capacitor is turned on. The first gain may be larger than the second gain.

In some embodiments, a method includes providing a circuit. The circuit includes a transistor stage including an input terminal, an output terminal and a further terminal; a first switchable capacitor connected to the further terminal of the transistor stage; and a second switchable capacitor connected to the output terminal of the transistor stage. The method also includes selectively turning on one of the first switchable capacitor and the second switchable capacitor and turning off the other of the first switchable capacitor and the second switchable capacitor. A location of a first pole of a frequency response of the circuit may be determined at least in part by a parasitic capacitance at the output terminal of the transistor stage when the first switchable capacitor is turned on. A location of a second pole of the frequency response of the circuit may be determined at least in part by the second switchable capacitor when the second switchable capacitor is turned on.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit, comprising:
a transistor stage comprising a first input/output terminal and a second input/output terminal;
a resistive element connected to the transistor stage;
a first tunable capacitive element connected in parallel with the resistive element;
a second tunable capacitive element connected to the second input/output terminal of the transistor stage, wherein the first tunable capacitive element and the second tunable capacitive element are configured to be selectively turned on and off to provide different frequency responses, and wherein a resistance value of the resistive element is substantially fixed.

2. The circuit of claim 1, wherein the transistor stage is a differential transistor pair comprising a first transistor and a second transistor, and wherein the first input/output terminal is a differential input terminal and the second input/output terminal is a differential output terminal.

3. The circuit of claim 2, wherein each of the first transistor and the second transistor comprises a control terminal, a first main terminal and a second main terminal; and wherein a first terminal of the resistive element is connected to the second main terminal of the first transistor and a second terminal of the resistive element is connected to the second main terminal of the second transistor.

4. The circuit of claim 1, wherein the first tunable capacitive element is a capacitor bank.

5. The circuit of claim 4, wherein the first tunable capacitive element is a programmable capacitor bank comprising a capacitor and a switch connected to the capacitor.

6. The circuit of claim 5, wherein the programmable capacitor bank comprises a plurality of capacitors and a plurality of switches, each of the plurality of switches connected to a respective one of the plurality of capacitors.

7. The circuit of claim 1, wherein the circuit is configured to operate in a first mode and a second mode, wherein the first tunable capacitive element is turned on and the second tunable capacitive element is turned off in the first mode, and wherein the second tunable capacitive element is turned on and the first tunable capacitive element is turned off in the second mode.

8. The circuit of claim 7, wherein the first mode is an equalization mode, and wherein a boost gain of the transistor stage is determined at least in part by a capacitance value of the first tunable capacitive element.

9. The circuit of claim 8, wherein a bandwidth of the transistor stage is substantially determined by a parasitic capacitance at the second input/output terminal of the transistor stage.

10. The circuit of claim 7, wherein the second mode is a buffer mode, and wherein a boost gain of the transistor stage is determined at least in part by a capacitance value of the second tunable capacitive element.

11. The circuit of claim 10, wherein a parasitic capacitance of at least one terminal of the resistive element contributes to the boost gain.

12. The circuit of claim 1, further comprising a load stage comprising a resistive element.

13. A circuit, the circuit comprising:
a differential transistor pair comprising a differential input and a differential output;
a resistor connected in parallel with the differential transistor pair;
a first switchable capacitor connected in parallel with the resistor, wherein a first gain of the circuit in a frequency region of interest is determined at least in part by a capacitance value of the first switchable capacitor; and
a second switchable capacitor connected to the differential output of the differential transistor pair, wherein a second gain of the circuit in the frequency region of interest is determined at least in part by a capacitance value of the second switchable capacitor,
wherein the circuit is configured such that, in operation, one of the first switchable capacitor and the second switchable capacitor is turned on and the other of the first switchable capacitor and the second switchable capacitor is turned off, wherein the circuit has the first gain when the first switchable capacitor is turned on and the second gain when the second switchable capacitor is turned on, wherein the first gain is larger than the second gain, and wherein a resistance value of the resistor is substantially fixed.

14. The circuit of claim 13, wherein the first switchable capacitor and the second switchable capacitor are configured such that a capacitance value of the first switchable capacitor and a capacitance value of the second switchable capacitor are programmable.

15. The circuit of claim 13, further comprising a load stage comprising a resistive element.

16. A method, comprising:
providing a circuit comprising:
a transistor stage comprising an input terminal, an output terminal and a further terminal;
a first switchable capacitor connected to the further terminal of the transistor stage; and
a second switchable capacitor connected to the output terminal of the transistor stage; and
selectively turning on one of the first switchable capacitor and the second switchable capacitor and turning off the other of the first switchable capacitor and the second switchable capacitor, wherein a location of a first pole of a frequency response of the circuit is determined at least in part by a parasitic capacitance at the output terminal of the transistor stage when the first switchable capacitor is turned on, wherein a location of a second pole of the frequency response of the circuit is determined at least in part by the second switchable capacitor when the second switchable capacitor is turned on.

17. The method of claim 16, wherein the circuit further comprises a resistive element connected to the further terminal of the transistor stage and in parallel with the first switchable capacitor.

18. The method of claim 16, wherein the circuit further comprises a load stage, and wherein the second pole is determined at least in part by a resistance of the load stage and a capacitance of the second switchable capacitor.

19. The circuit of claim 13, wherein a bandwidth of the differential transistor pair is substantially determined by a parasitic capacitance at the differential output of the differential transistor pair.

20. The circuit of claim 13, wherein a parasitic capacitance of at least one terminal of the resistor contributes to the second gain.

* * * * *